(12) United States Patent
Murazaki (10) Patent No.: US 11,292,963 B2
(45) Date of Patent: Apr. 5, 2022

(54) WAVELENGTH CONVERTING MEMBER AND METHOD FOR PRODUCING THE SAME

(71) Applicant: NICHIA CORPORATION, Anan (JP)

(72) Inventor: Yoshinori Murazaki, Komatsushima (JP)

(73) Assignee: NICHIA CORPORATION, Anan (JP)

(*) Notice: Subject to any disclaimer, the term of this patent is extended or adjusted under 35 U.S.C. 154(b) by 238 days.

(21) Appl. No.: 16/212,450

(22) Filed: Dec. 6, 2018

(65) Prior Publication Data

US 2019/0177607 A1  Jun. 13, 2019

(30) Foreign Application Priority Data

Dec. 8, 2017  (JP) .............................. JP2017-236068

(51) Int. Cl.
*C09K 11/02* (2006.01)
*C09K 11/77* (2006.01)
(Continued)

(52) U.S. Cl.
CPC .............. *C09K 11/02* (2013.01); *C04B 35/44* (2013.01); *C04B 35/645* (2013.01);
(Continued)

(58) Field of Classification Search
CPC ............ C09K 11/7774; C09K 11/7734; C09K 11/7792; C09K 11/7706; C09K 11/643;
(Continued)

(56) References Cited

U.S. PATENT DOCUMENTS 7,902,564 B2  3/2011  Mueller-Mach et al.
8,169,136 B2  5/2012  Nakamura et al.
(Continued)

FOREIGN PATENT DOCUMENTS

EP       1670070 A1      6/2006
JP    2009091546 A  *  4/2009
(Continued)

OTHER PUBLICATIONS

Machine translation of JP-2009091546-A, 23 pages. (Year: 2009).*
(Continued)

*Primary Examiner* — Matthew E. Hoban
*Assistant Examiner* — Lynne Edmondson
(74) *Attorney, Agent, or Firm* — Hunton Andrews Kurth LLP (57) ABSTRACT

Provided is a wavelength converting member and a method of producing the same. Proposed is a wavelength converting member including: a fluorescent material containing at least one kind selected from a nitride-based fluorescent material and an oxynitride-based fluorescent material; and an aluminate containing at least one kind selected from the group consisting of a rare earth aluminate and an alkaline earth metal aluminate. Further, a method of producing a wavelength converting member, including: preparing a molded body obtained by mixing a fluorescent material containing at least one kind selected from a nitride-based fluorescent material and an oxynitride-based fluorescent material and an aluminate containing at least one kind selected from the group consisting of a rare earth aluminate and an alkaline earth metal aluminate; and sintering the molded body to obtain a wavelength converting member containing the fluorescent material and the aluminate, is proposed.

15 Claims, 1 Drawing Sheet

(51) Int. Cl.
*C04B 35/645* (2006.01)
*C04B 35/44* (2006.01)
*H01L 33/50* (2010.01)
*C09K 11/08* (2006.01)

(52) U.S. Cl.
CPC ...... *C09K 11/0883* (2013.01); *C09K 11/7734* (2013.01); *C09K 11/7774* (2013.01); *C09K 11/7792* (2013.01); *H01L 33/502* (2013.01); *C04B 2235/3222* (2013.01); *C04B 2235/3873* (2013.01); *C04B 2235/5436* (2013.01); *C04B 2235/9661* (2013.01); *H01L 2933/0041* (2013.01)

(58) Field of Classification Search
CPC ............ C09K 11/7703; C09K 11/7718; C09K 11/7721; C09K 11/7728; C09K 11/7746; C09K 11/7749; C09K 11/7761; C09K 11/7764; C09K 11/7783; C09K 11/7731; C09K 11/02; C09K 11/025; C04B 35/44; C04B 35/597; C04B 35/6455; C04B 35/645; C04B 35/593; C04B 2235/77; C04B 2235/5436; C04B 2235/3222; C04B 2235/3852; C04B 2235/3873; H01L 33/502
See application file for complete search history.

(56) References Cited

U.S. PATENT DOCUMENTS

| | | |
|---|---|---|
| 8,502,442 B2 | 8/2013 | Nakamura et al. |
| 9,605,201 B2 | 3/2017 | Yamaguchi |
| 10,267,963 B2 | 4/2019 | Fujita et al. |
| 2005/0156496 A1 | 7/2005 | Takashima et al. |
| 2008/0149956 A1* | 6/2008 | Mueller-Mach ...... H01L 33/501 257/98 |
| 2008/0258110 A1 | 10/2008 | Oshio |
| 2009/0212697 A1 | 8/2009 | Nakamura et al. |
| 2011/0084293 A1 | 4/2011 | Mueller-Mach et al. |
| 2012/0194066 A1 | 8/2012 | Nakamura et al. |
| 2013/0280520 A1* | 10/2013 | Pan ........................ B32B 18/00 428/331 |
| 2015/0184070 A1 | 7/2015 | Kim et al. |
| 2015/0219291 A1 | 8/2015 | Yamaguchi |
| 2017/0321866 A1* | 11/2017 | Asami ................... F21S 41/141 |
| 2018/0275324 A1 | 9/2018 | Fujita et al. |
| 2019/0031956 A1 | 1/2019 | Inata et al. |

FOREIGN PATENT DOCUMENTS

| | | |
|---|---|---|
| JP | 2009091546 A | 4/2009 |
| JP | 2009096653 A | 5/2009 |
| JP | 2010514189 A | 4/2010 |
| JP | 2011513898 A | 4/2011 |
| JP | 2014201726 A | 10/2014 |
| JP | 2014234487 A | 12/2014 |
| JP | 2015149394 A | 8/2015 |
| JP | 2015199640 A | 11/2015 |
| JP | 2016119383 A | 6/2016 |
| JP | 2016180076 A | 10/2016 |
| JP | 2017107071 A | 6/2017 |
| JP | 2018021193 A | 2/2018 |
| JP | 2018043912 A | 3/2018 |
| WO | 2016117623 A1 | 7/2016 |
| WO | 2017170609 A1 | 10/2017 |
| WO | 2018021418 A1 | 2/2018 |

OTHER PUBLICATIONS

Non-Final Office Action, United States Patent and Trademark Office issued to U.S. Appl. No. 16/199,922, filed Jun. 8, 2020, 19 pages.
Final Office Action, United States Patent and Trademark Office issued to U.S. Appl. No. 16/199,922, filed Sep. 14, 2020, 11 pages.
Third party submission, United States Patent and Trademark Office issued to U.S. Appl. No. 16/199,922 dated Oct. 25, 2019, 14 pages.

* cited by examiner

WAVELENGTH CONVERTING MEMBER AND METHOD FOR PRODUCING THE SAME

CROSS-REFERENCE TO RELATED PATENT APPLICATION

This application claims priority to Japanese Patent Application No. 2017-236068, filed on Dec. 8, 2017, the disclosure of which is hereby incorporated by reference in its entirety.

BACKGROUND

Technical Field

The present invention relates to a wavelength converting member that converts the wavelength of light emitted from a light emitting diode (hereinafter also referred to as "LED") or a laser diode (hereinafter also referred to as "LD"), and a method for producing the same. In this specification, the "fluorescent material" is used in the same meaning as a "fluorescent phosphor".

Description of Related Art

A light emitting device using a light emitting element such as an LED or an LD is a light source having high light conversion efficiency, and is being utilized as a light source that replaces a filament lamp and a fluorescent lamp, due to the small electric power consumption, the long lifetime, and the capability of size reduction thereof. The light emitting device using a light emitting element such as an LED or an LD is being utilized in a wide variety of fields including a lighting system for automobile or indoor use, a backlight source for a liquid crystal display device, a lighting system for an illumination or a projector. In particular, a light emitting device that has a combination of a light emitting element emitting blue light and a yellow fluorescent material, and emits mixed color light thereof has been widely utilized.

The known fluorescent materials used in the light emitting device include a rare earth aluminate fluorescent material which is an oxide represented by $(Y,Gd,Tb,Lu)_3(Al,Ga)_5O_{12}:Ce$, a nitride-based fluorescent material represented by $CaAlSiN_3:Eu$, an oxynitride-based fluorescent material such as a $\beta$-SiAlON fluorescent material.

As the wavelength converting member, for example, a wavelength converting member formed of a sintered body obtained by mixing glass powder and inorganic fluorescent material powder, and melting and solidifying the glass powder is disclosed in Japanese Unexamined Patent Publication No. 2014-234487.

However, the wavelength converting member disclosed in Japanese Unexamined Patent Publication No. 2014-234487 may not provide sufficient light emission depending on a type of the fluorescent material to be combined with glass powder. The glass component may adversely affect to the inorganic fluorescent material during formation of the sintered body, and may cause remarkable decrease in light conversion efficiency. Also, in the sintered body formed by sintering the glass and the inorganic fluorescent material, it is difficult to obtain a sintered body having high density. In the sintered body formed by sintering the glass and the inorganic fluorescent material, a proportion of voids present in the sintered body is high, and thus the light conversion efficiency decreases when using in a light emitting device. In addition, when a binder constituting the sintered body to be a wavelength converting member is made of glass having a low melting point, there is a possibility that the glass having a low melting point is melted in the case of irradiating excitation light having high light density, such as a laser light source, and thus the heat resistance is also low. Further, when the inorganic fluorescent material is a fluorescent material containing at least one kind selected from the group consisting of a nitride-based fluorescent material and an oxynitride-based fluorescent material, nitrogen contained in the nitride-based fluorescent material or the oxynitride-based fluorescent material and oxygen contained in an oxide constituting the glass are easily reacted. Thus, when the fluorescent material and the glass are calcined, the nitride-based fluorescent material or the oxynitride-based fluorescent material and the glass are reacted, and the fluorescent material is oxidized to change the crystal structure, so that the sintered body obtained after the calcination may not emit light.

Accordingly, an embodiment of the present disclosure has an object to provide a wavelength converting member, which is formed of ceramics containing a nitride-based fluorescent material and/or an oxynitride-based fluorescent material, having high light conversion efficiency.

SUMMARY

Means for Solving the Above Problems Includes the Following Embodiments

A first embodiment of the present disclosure is a wavelength converting member comprising: a fluorescent material containing at least one kind selected from a nitride-based fluorescent material and an oxynitride-based fluorescent material; and an aluminate containing at least one kind selected from the group consisting of a rare earth aluminate and an alkaline earth metal aluminate.

A second embodiment of the present disclosure is a method for producing a wavelength converting member, comprising: preparing a molded body obtained by mixing a fluorescent material containing at least one kind selected from a nitride-based fluorescent material and an oxynitride-based fluorescent material and an aluminate containing at least one kind selected from the group consisting of a rare earth aluminate and an alkaline earth metal aluminate; and calcining the molded body to obtain a wavelength converting member containing the fluorescent material and the aluminate.

In accordance with the embodiments of the present disclosure, a wavelength converting member, which is formed of ceramics containing a nitride-based fluorescent material and/or an oxynitride-based fluorescent material, having high light conversion efficiency, and a method for producing the same, can be provided.

DETAILED DESCRIPTION

The wavelength converting member and the method for producing the same according to the present disclosure are described hereunder on the basis of embodiments. The embodiments shown below are exemplifications for exemplifying the technical concept of the present invention, and the present invention is not limited to the methods for producing a wavelength converting member below.

Standards according to JIS Z8110 are applied to the relations between color names and chromaticity coordinates, the relations between wavelength ranges of light and color names of monochromatic lights.

Wavelength Converting Member

The wavelength converting member according to the first embodiment of the present disclosure comprises a fluorescent material containing at least one kind selected from the group consisting of a nitride-based fluorescent material and an oxynitride-based fluorescent material, and an aluminate containing at least one kind selected from the group consisting of a rare earth aluminate and an alkaline earth metal aluminate.

The wavelength converting member according to the first embodiment of the present disclosure contains, in addition to a nitride-based fluorescent material and/or an oxynitride-based fluorescent material, an aluminate which is hard to react with a nitride and/or an oxynitride as compared with an oxide. Thus, the aluminate serves as a binder, and a wavelength converting member formed of ceramics containing a nitride-based fluorescent material and/or an oxynitride-based fluorescent material can be obtained while maintaining the light conversion efficiency of the nitride-based fluorescent material and/or the oxynitride-based fluorescent material. The wavelength converting member according to the first embodiment of the present disclosure has high thermal conductivity, since the thermal conductivity of the aluminate functioning as a binder is high. Further, the wavelength converting member according to the first embodiment of the present disclosure is formed of ceramics, and therefore has high heat resistance.

Aluminate

At least one kind of aluminate selected from the group consisting of a rare earth aluminate and an alkaline earth metal aluminate may be used alone, or may be used in combination of two or more kinds thereof. In the case of using two or more kinds of aluminates, two or more kinds of rare earth aluminates may be used in combination, two or more kinds of alkaline earth metal aluminates may be used in combination, and one or more kinds of rare earth aluminates and one or more kinds of alkaline earth metal aluminates may be used in combination. In the present specification, at least one kind of aluminate selected from the group consisting of a rare earth aluminate and an alkaline earth metal aluminate refers to an aluminate not containing an activating element, or an aluminate containing an activating element in a tiny amount to the extent not to emit light by excitation light from a light source. In the present specification, at least one kind of aluminate selected from the group consisting of a rare earth aluminate and an alkaline earth metal aluminate refers to an aluminate, in which the content of the activating element is, for example, less than 50 ppm in terms of mass, even in the case of containing the activating element such as Ce, Eu, or Mn. By setting the content of the activating element to such amount, the aluminate can function as a binder for the fluorescent material, but not as the fluorescent material.

Rare Earth Aluminate

The rare earth aluminate is preferably at least one kind selected from the group consisting of $Y_3Al_5O_{12}$, $(Y,Gd)_3Al_5O_{12}$, $Y_3(Al,Ga)_5O_{12}$, $(Y,Gd)_3(Al,Ga)_5O_{12}$, $Tb_3Al_5O_{12}$, and $Lu_3Al_5O_{12}$. The rare earth aluminate is preferred, since the rare earth aluminate is hard to react with a nitride-based fluorescent material or an oxynitride-based fluorescent material, and the crystal structure of the fluorescent material is not decomposed and the rare earth aluminate functions as a binder even by sintering together with the fluorescent material, thereby obtaining a sintered body containing the fluorescent material. Among these, the rare earth aluminate is preferably $Y_3Al_5O_{12}$, since it has high transparency, hard to react with a nitride or an oxynitride, and inexpensive and easily available. In the compositional formula expressing a compound in the present specification, plural elements delimited with commas (,) mean that at least one of the plural elements is contained in the composition of the compound. The plural elements delimited with commas (,) in the compositional formula expressing a compound mean that the composition contains at least one element selected from the plural elements delimited with commas in the compositional formula, and may contain a combination of two or more elements selected from the plural elements.

Alkaline Earth Metal Aluminate

The alkaline earth metal aluminate is preferably at least one kind selected from the group consisting of $(Ca,Sr,Ba)Al_2O_4$, $(Ca,Sr,Ba)_4Al_{14}O_{25}$, $(Ca,Sr,Ba)Al_{12}O_{19}$, $(Ca,Sr,Ba)Mg_2Al_{16}O_{27}$, and $(Ca,Sr,Ba)MgAl_{10}O_{17}$. The alkaline earth metal aluminate represented by $(Ca,Sr,Ba)Al_2O_4$, $(Ca,Sr,Ba)_4Al_{14}O_{25}$, $(Ca,Sr,Ba)Al_{12}O_{19}$, $(Ca,Sr,Ba)Mg_2Al_{16}O_{27}$, or $(Ca,Sr,Ba)MgAl_{10}O_{17}$ may contain at least one kind of alkaline earth metal element selected from the group consisting of Ca, Sr, and Ba, and may contain two or more kinds of alkaline earth metal elements selected from the group consisting of Ca, Sr, and Ba in the aluminate. The alkaline earth metal aluminate is preferred, since the alkaline earth metal aluminate is hard to react with a nitride-based fluorescent material and/or an oxynitride-based fluorescent material, and the crystal structure of the fluorescent material is not decomposed and the alkaline earth metal aluminate functions as a binder even by sintering together with the fluorescent material, thereby obtaining a sintered body containing the fluorescent material.

Nitride-Based Fluorescent Material

The nitride-based fluorescent material is preferably at least one kind selected from the group consisting of $(Ca,Sr,Ba)AlSiN_3$:Eu, $(Ca,Sr,Ba)AlSiN_3$:Ce, $(Ca,Sr,Ba)_2Si_5N_8$:Eu, $SrLiAl_3N_4$:Eu, $La_3Si_6N_{11}$:Ce, $CaAlSiN_3$:Eu, $CaAlSiN_3$:Ce, $(Ca,Sr)AlSiN_3$:Eu, $(Ca,Sr)AlSiN_3$:Ce, $Ca_2Si_5N_8$:Eu, and $(Ca,Sr)_2Si_5N_8$:Eu. Among these, the nitride-based fluorescent material is preferably $CaAlSiN_3$:Eu, since a desired color tone can be easily obtained and it is easily available. It is preferred that the wavelength converting member contains $CaAlSiN_3$:Eu as a fluorescent material and $Y_3Al_5O_{12}$ as a rare earth aluminate, since a desired red color tone can be easily obtained and these are easily available.

The nitride-based fluorescent material absorbs light emitted from an excitation light source having a light emission peak wavelength in a range of 380 nm or more and 485 nm or less, and emits red light having a light emission peak wavelength in a range of 590 nm or more and 780 nm or less. However, some nitride-based fluorescent materials emit light in other wavelength ranges. For example, $La_3Si_6N_{11}$:Ce emits yellow-green light having a light emission peak in the vicinity of 530 nm. The nitride-based fluorescent material in the wavelength converting member is hard to react with the aluminate functioning as a binder, and the crystal structure is not decomposed. Thus, the nitride-based fluorescent material can absorb light emitted from an excitation light source, and can emit fluorescent color light having a light emission peak in a desired wavelength range.

Oxynitride-Based Fluorescent Material

The oxynitride-based fluorescent material is preferably at least one kind selected from the group consisting of $BaSi_2O_2N_2$:Eu; $Ba_3Si_6O_{12}N_2$:Eu; $M_{m/2}Si_{12-(m+n)}Al_{(m+n)}O_nN_{(16-n)}$:Eu wherein M represents at least one kind of element selected from the group consisting of Sr, Ca, Li, and Y, parameters n and m satisfy $0.0 \leq n \leq 2.5$ and $0.5 \leq m \leq 5$ respectively, and the parameter n is an electric charge of M; and $Si_{6-z}Al_zO_zN_{8-z}$:Eu wherein parameter z satisfies $0<z<4.2$. The oxynitride-based fluorescent material absorbs light emitted from an excitation light source having a light emission peak wavelength in a range of 380 nm or more and 485 nm or less, and emits light from blue-green to red-orange, which has a light emission peak wavelength in a range of 470 nm or more and 620 nm or less, depending on a type of the oxynitride-based fluorescent material. The oxynitride-based fluorescent material in the wavelength converting member is hard to react with the aluminate functioning as a binder, and the crystal structure is not decomposed. Thus, the oxynitride-based fluorescent material can absorb light emitted from an excitation light source, and can emit fluorescent color light having a light emission peak in a desired wavelength range.

At least one kind of fluorescent material selected from the group consisting of a nitride-based fluorescent material and an oxynitride-based fluorescent material may be used alone, or may be used in combination of two or more kinds thereof as long as emission of fluorescent color light having a desired color tone can be obtained by excitation light. In the case of using two or more kinds of fluorescent materials, two or more kinds of nitride-based fluorescent materials may be used in combination, two or more kinds of oxynitride-based fluorescent materials may be used in combination, and one or more kinds of nitride-based fluorescent materials and one or more kinds of oxynitride-based fluorescent materials may be used in combination.

Other Fluorescent Material

The wavelength converting member may further contain a fluorescent material other than the nitride-based fluorescent material and the oxynitride-based fluorescent material. The fluorescent material other than the nitride-based fluorescent material and the oxynitride-based fluorescent material, which is contained in the wavelength converting member, is preferably a fluorescent material having a composition of an aluminate. The fluorescent material having a composition of an aluminate is preferably at least one kind selected from the group consisting of a rare earth aluminate fluorescent material and an alkaline earth metal aluminate fluorescent material. The fluorescent material having a composition of an aluminate also functions as a binder in the same manner as the aluminate constituting a binder in the wavelength converting member. As long as the wavelength converting member can provide a fluorescent color having a desired color tone, the fluorescent material having a composition of an aluminate may be used as a binder instead of the aluminate not containing an activating element or the aluminate containing an activating element in an amount of less than 50 ppm in terms of mass.

It is preferred that the wavelength converting member further comprises at least one kind of rare earth aluminate fluorescent material selected from the group consisting of $Y_3Al_5O_{12}$:Ce, $(Y,Gd)_3Al_5O_{12}$:Ce, $Y_3(Al,Ga)_5O_{12}$:Ce, $(Y,Gd)_3(Al,Ga)_5O_{12}$:Ce, $Tb_3Al_5O_{12}$:Ce, and $Lu_3Al_5O_{12}$:Ce. In each of the rare earth aluminate fluorescent materials, a part of the composition of the aluminate not containing an activating element such as Ce or the aluminate in which the content of the activating element is less than 50 ppm in terms of mass is replaced with the activating element such as Ce. The rare earth aluminate fluorescent material containing an activating element can also be utilized as a binder in the wavelength converting member in the same manner as the aluminate that does not emit light by excitation light, such as the aluminate in which the content of the activating element is less than 50 ppm in terms of mass. The rare earth aluminate fluorescent material can be distinguished from the rare earth aluminate used as the binder in that the total amount of activating elements in the rare earth aluminate fluorescent material is 50 ppm by mass or more, while the total amount of activating elements in the rare earth aluminate used as the binder is less than 50 ppm by mass.

It is preferred that the wavelength converting member further comprises at least one kind of alkaline earth metal aluminate fluorescent material selected from the group consisting of $SrAl_2O_4$:Eu, $Sr_4Al_{14}O_{25}$:Eu, $BaMg_2Al_{16}O_{27}$:Eu, $BaMgAl_{10}O_{17}$:Mn, $BaMgAl_{10}O_{17}$:Eu, $Sr_4Al_{14}O_{25}$:Eu,Mn, $CaAl_2O_4$:Eu,Mn, $BaMg_2Al_{16}O_{27}$:Eu,Mn, and $BaMgAl_{10}O_{17}$:Eu,Mn. In the alkaline earth metal aluminate fluorescent material represented by each of the compositions, a part of the composition of the alkaline earth metal aluminate not containing an activating element constituting a binder in the wavelength converting member or the alkaline earth metal aluminate in which the content of an activating element is less than 50 ppm in terms of mass is replaced with activating elements such as Eu, Mn, or Eu and Mn. The alkaline earth metal aluminate fluorescent material can be distinguished from the alkaline earth metal aluminate used as the binder in that the total amount of activating elements in the alkaline earth metal aluminate fluorescent material is 50 ppm by mass or more, while the total amount of activating elements in the alkaline earth metal aluminate used as the binder is less than 50 ppm by mass.

The alkaline earth metal aluminate fluorescent material containing an activating element can also be utilized as a binder in the wavelength converting member in the same manner as the alkaline earth metal aluminate in which the content of an activating element is less than 50 ppm in terms of mass.

At least one kind of fluorescent material selected from the group consisting of a rare earth aluminate fluorescent material and an alkaline earth metal aluminate fluorescent material may be used alone, or may be used in combination of two or more kinds thereof as long as emission of fluorescent color light having a desired color tone can be obtained by excitation light. In the case of using two or more kinds of fluorescent materials, two or more kinds of rare earth aluminate fluorescent materials may be used in combination, two or more kinds of alkaline earth metal aluminate fluorescent materials may be used in combination, and one or more kinds of rare earth aluminate fluorescent materials and one or more kinds of alkaline earth metal aluminate fluorescent materials may be used in combination.

Method for Producing Wavelength Converting Member

The method of producing a wavelength converting member according to the second embodiment of the present disclosure comprises: preparing a molded body obtained by mixing a fluorescent material containing at least one kind selected from the group consisting of a nitride-based fluorescent material and an oxynitride-based fluorescent material and an aluminate containing at least one kind selected from the group consisting of a rare earth aluminate and an alkaline earth metal aluminate; and sintering the molded body to obtain a wavelength converting member containing the fluorescent material and the aluminate.

In accordance with the production method according to the second embodiment of the present disclosure, the wavelength converting member is formed of a sintered body obtained by sintering a molded body containing: a fluorescent material containing at least one kind selected from a nitride-based fluorescent material and an oxynitride-based fluorescent material; and an aluminate containing at least one kind selected from the group consisting of a rare earth aluminate and an alkaline earth metal aluminate. Thus, a wavelength converting member formed of ceramics containing an aluminate functioning as a binder and a nitride-based fluorescent material and/or an oxynitride-based fluorescent material can be obtained while maintaining the light conversion efficiency of the nitride-based fluorescent material and/or the oxynitride-based fluorescent material. The wavelength converting member obtained by the production method according to the second embodiment of the present disclosure has high thermal conductivity, since the thermal conductivity of the aluminate functioning as a binder in the wavelength converting member is high. Further, the wavelength converting member obtained by the production method according to the second embodiment of the present disclosure is formed of ceramics, and therefore has high heat resistance.

Aluminate

Specifically, at least one kind of the aforementioned aluminate can be used as an aluminate.

The charge-in amount of the aluminate is preferably 50% by mass or more, more preferably 60% by mass or more, even more preferably 65% by mass or more, relative to 100% by mass of the total amount of mixed powder obtained by mixing the aluminate and the fluorescent material containing at least one kind selected from the group consisting of a nitride-based fluorescent material and an oxynitride-based fluorescent material. Further, the content of the aluminate in the wavelength converting member is the same as the mass ratio of the aluminate powder relative to 100% by mass of the total amount of the mixed powder obtained by mixing the aluminate powder and the fluorescent material powder. When the content of the aluminate contained in the wavelength converting member is 50% by mass or more relative to 100% by mass of the total amount of the mixed powder obtained by mixing the aluminate and the fluorescent material, a sintered body, which contains the aluminate functioning as a binder without hindering light emission of a nitride-based fluorescent material or an oxynitride-based fluorescent material having a light emission peak wavelength within a desired wavelength range, can be obtained. The content of the aluminate may be more than 99% by mass relative to 100% by mass of the total amount of the mixed powder obtained by mixing the aluminate powder and the fluorescent material powder, but the content of the fluorescent material contained in the wavelength converting member becomes relatively low. Thus, the content of the aluminate is preferably 99% by mass or less in order to provide emission of fluorescent color light having a desired color tone by excitation light emitted from a light source.

Average Particle Diameter of Aluminate

The average particle diameter of the aluminate mixed with the fluorescent material is preferably in a range of 1 μm or more and 25 μm or less, more preferably in a range of 2 μm or more and 20 μm or less, even more preferably in a range of 2 μm or more and 18 μm or less. When the average particle diameter of the aluminate powder before constituting the wavelength converting member falls within the aforementioned range, a molded body can be formed by substantially uniformly mixing the aluminate and the fluorescent material, and a wavelength converting member, in which the fluorescent material is uniformly present in the wavelength converting member to be obtained, capable of uniformly emitting light can be obtained. When the average particle diameter of the aluminate powder is 25 μm or less, voids in the wavelength converting member are decreased, and thus the light conversion efficiency can be enhanced. In the present specification, the average particle diameter of the aluminate powder refers to an average particle diameter (Fisher Sub-Sieve Sizer's number) measured by a Fisher Sub-Sieve Sizer (FSSS) method.

The FSSS method is a type of an air permeability method for measuring a specific surface area by utilizing the flow resistance of air to determine a particle diameter.

Content of Nitride-Based Fluorescent Material and/or Oxynitride-Based Fluorescent Material Specifically, at least one kind of the fluorescent material selected from the group consisting of the aforementioned nitride-based fluorescent material and the oxynitride-based fluorescent material can be used as at least one kind of fluorescent material selected from the group consisting of a nitride-based fluorescent material and an oxynitride-based fluorescent material.

The content of at least one kind of the fluorescent material selected from the group consisting of a nitride-based fluorescent material and an oxynitride-based fluorescent material is preferably in a range of 1% by mass or more and 50% by mass or less, more preferably in a range of 2% by mass or more and 20% by mass or less, even more preferably 3% by mass or more and 18% by mass or less, relative to 100% by mass of the total amount of mixed powder of the fluorescent material and the aluminate. The content of the nitride-based fluorescent material and/or the oxynitride-based fluorescent material in the wavelength converting member is the same as the mass ratio of the powder of the nitride-based fluorescent material and/or the oxynitride-based fluorescent material relative to 100% by mass of the total amount of the mixed powder obtained by mixing the aluminate powder and the fluorescent material powder. The content of the nitride-based fluorescent material and/or the oxynitride-based fluorescent material in the wavelength converting member is not particularly limited as long as emission of fluorescent color light having a light emission peak in a desired wavelength range can be obtained by absorbing light from an excitation light source.

Content of Other Fluorescent Material

Specifically, in the case of containing at least one kind of the fluorescent material selected from the group consisting of the aforementioned rare earth aluminate fluorescent material and the alkaline earth metal aluminate fluorescent material in addition to at least one kind of the fluorescent material selected from the group consisting of a nitride-based fluorescent material and an oxynitride-based fluorescent material, at least one kind selected from the group consisting of the aforementioned rare earth aluminate fluorescent material and the alkaline earth metal aluminate fluorescent material is preferably contained.

The content of at least one kind of the aluminate fluorescent material selected from the group consisting of a rare earth aluminate fluorescent material and an alkaline earth metal aluminate fluorescent material is not particularly limited as long as emission of fluorescent color light having a desired color tone can be obtained. At least one kind of the aluminate fluorescent material selected from the group consisting of a rare earth aluminate fluorescent material and an alkaline earth metal aluminate fluorescent material may not be contained in the wavelength converting member, and the content of the aluminate fluorescent material may be 0% by mass relative to 100% by mass of the total amount of the mixed powder obtained by mixing the fluorescent material powder and the aluminate powder. The content of the rare earth aluminate fluorescent material and/or the alkaline earth metal aluminate fluorescent material in the wavelength converting member is the same as the mass ratio of the powder of the rare earth aluminate fluorescent material and/or the alkaline earth metal aluminate fluorescent material relative to 100% by mass of the total amount of the mixed powder obtained by mixing the aluminate powder and the fluorescent material powder. As long as the wavelength converting member can provide emission of fluorescent color light having a desired color tone, the content of the aluminate fluorescent material is preferably 50% by mass or less, more preferably in a range of 1% by mass or more and 20% by mass or less, even more preferably in a range of 1% by mass or more and 18% by mass or less, relative to 100% by mass of the total amount of the mixed powder obtained by mixing the aluminate powder and the fluorescent material powder.

Average Particle Diameter of Fluorescent Material

The average particle diameter of the fluorescent material mixed with the aluminate is preferably in a range of 1 μm or more and 25 μm or less, more preferably in a range of 2 μm or more and 20 μm or less, even more preferably in a range of 2 μm or more and 15 μm or less. When the average particle diameter of the fluorescent material is 1 μm or more, the aluminate powder and the fluorescent material powder are substantially uniformly dispersed, and a wavelength converting member, in which the fluorescent material is uniformly present, capable of uniformly emitting light can be obtained. When the average particle diameter of the fluorescent material mixed with the aluminate is 25 μm or less, voids in the wavelength converting member are reduced, and thus high light conversion efficiency can be maintained in the fluorescent material. The fluorescent material is at least one kind of fluorescent material selected from the group consisting of a nitride-based fluorescent material, an oxynitride-based fluorescent material, a rare earth aluminate fluorescent material, and an alkaline earth metal aluminate fluorescent material. In the present specification, the average particle diameter of the fluorescent material refers to an average particle diameter (Fisher Sub-Sieve Sizer's number) measured by a Fisher Sub-Sieve Sizer (FSSS) method.

Figure 1:
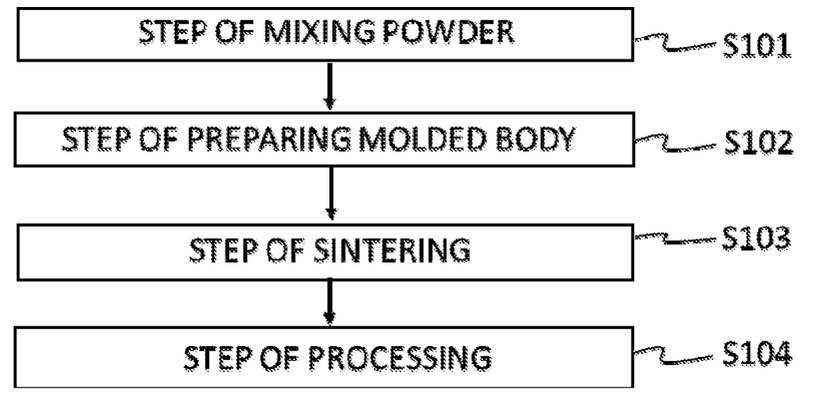
FIG. 1 is a flowchart showing the process sequence of a method for producing a wavelength converting member according to an embodiment of the present disclosure.

FIG. 1 is a flowchart showing an illustrative of the order of steps in the method for producing a wavelength converting member according to the second embodiment. The steps in the method for producing a wavelength converting member will be described with reference to FIG. 1. The method for producing a wavelength converting member includes Step S102 of preparing a molded body and Step S103 of sintering. The method for producing a wavelength converting member may include Step S101 of mixing powder before Step S102 of preparing the molded body, and may include Step S104 of processing the wavelength converting member after Step S013 of sintering.

Step of Mixing Powder

In the step of mixing powder, fluorescent material powder containing at least one kind selected from the group consisting of a nitride-based fluorescent material and an oxynitride-based fluorescent material; and aluminate powder containing at least one kind selected from the group consisting of a rare earth aluminate and an alkaline earth metal aluminate are mixed to obtain mixed powder. The powders can be mixed by using a mortar and a pestle. The powders can also be mixed by using a mixing medium such as a ball mill.

Step of Preparing Molded Body

In the step of preparing molded body, the mixed powder containing the fluorescent material powder and the aluminate powder is molded into a desired shape to obtain a molded body. The molding method of powder employed may be a known method such as a press molding method, and examples thereof may include a mold pressing method and a cold isostatic pressing (hereinafter also referred to as "CIP") method. For conditioning the shape of the molded body, two or more kinds of molding methods may be employed, and the CIP may be performed after performing the mold pressing.

Step of Sintering

In the step of sintering, the sintering is preferably performed according to a solid compression sintering method. Examples of the solid compression sintering method may include a hot isostatic pressing (HIP) treatment (hereinafter also referred to as "HIP treatment") and a spark plasma sintering method (also referred to as "SPS method"). By using any of the solid compression sintering methods, voids in the wavelength converting member formed of the sintered body to be obtained are decreased, and the density is increased, so that the light conversion efficiency can be enhanced.

In the case of performing the sintering according to the SPS method, by effectively applying electro-diffusion, in which pulse-like electric energy is directly charged to voids between particles of the molded body, and high energy of high temperature plasma (spark plasma) instantly generated by spark discharge is thermally diffused, the sintered body can be obtained in a short time.

Step of Processing Step

The method of producing a wavelength converting member may include step of processing for processing the wavelength converting member formed of the resulting sintered body. Examples of the step of processing may include a step of cutting the resulting wavelength converting member into a desired size. The cutting method used for the wavelength converting member may be a known method, and examples thereof may include blade dicing, laser dicing, and wire sawing.

In combination with a light emitting element such as an LED or an LD, the wavelength converting member according to the first embodiment or the wavelength converting member obtained by the production method according to the second embodiment converts light emitted from the light emitting element and can constitute a light emitting device that emits mixed light of light from the light emitting element and light that has undergone wavelength conversion by the wavelength converting member. For example, a light emitting element that emits light in a wavelength range of 350 nm or more and 500 nm or less can be used as the light emitting element. For example, a semiconductor light emitting element using a nitride-based semiconductor ($In_XAl_YGa_{1-X-Y}N$, $0 \leq X$, $0 \leq Y$, $X+Y \leq 1$) can be used as the light emitting element. The use of the semiconductor light emitting device as an excitation light source may provide a stable light emitting device that has high efficiency, high linearity of the output relative to the input, and high strength against a mechanical impact.

EXAMPLES

The present invention is hereunder specifically described by reference to the following Examples. The present invention is not limited to these Examples.

Example 1

Step of Mixing Powder 17 g of $Y_3Al_5O_{12}$ (also referred to as "YAG") crystalline powder having an average particle diameter of 3 μm and 1.5 g of CaAlSiN$_3$:Eu (hereinafter also referred to as "CASN") fluorescent material powder having an average particle diameter of 7 μm were weighed and mixed by using a mortar and a pestle to prepare mixed powder for forming a molded body. As for the YAG powder used in each of Examples 1 to 3, the content of the activating element (for example, Eu or the like) was less than 50 ppm in terms of mass. Relative to 100% by mass of the total amount of the YAG powder and the CASN fluorescent material powder, the content of the YAG powder was 91.9% by mass, and the content of the CASN fluorescent material powder was 8.1% by mass.

Step of Preparing of Molded Body

The mixed powder was filled into a mold to temporarily form a cylindrical molded body having a diameter of 25 mm and a thickness of 6 mm.

Step of Sintering

The resulting molded body was subjected to a sintering according to the HIP treatment with an HIP device (manufactured by Kobe Steel, Ltd.) using nitrogen gas as a pressure medium in a nitrogen gas atmosphere (nitrogen: 99% by volume or more) at 1,700° C. and 150 MPa for 10 hours to obtain a sintered body.

Step of Processing

The resulting sintered body was sliced with a wire saw, and ground and divided into individual pieces with a polishing device or a blade dicing, thereby obtaining a rectangular wavelength converting member having a size of 1 mm×1 mm and a thickness of 0.2 mm.

Example 2

A wavelength converting member was obtained in the same manner as in Example 1 except that a mixed powder was obtained by mixing 17 g of the YAG crystalline powder having an average particle diameter of 3 μm and 3 g of the CASN fluorescent material powder having an average particle diameter of 7 μm. In the sintered body to be the wavelength converting member of Example 2, the content of the YAG powder was 85% by mass, and the content of the CASN fluorescent material powder was 15% by mass, relative to 100% by mass of the total amount of the YAG powder and the CASN fluorescent material powder.

Example 3

A wavelength converting member was obtained in the same manner as in Example 1 except that a mixed powder was obtained by mixing 15.5 g of the YAG crystalline powder having an average particle diameter of 3 μm, 1.0 g of the CASN fluorescent material powder having an average particle diameter of 7 μm, and 3.5 g of Lu$_3$Al$_5$O$_{12}$:Ce (hereinafter also referred to as "LuAG:Ce") fluorescent material powder having an average particle diameter of 10 μm. In the sintered body to be the wavelength converting member of Example 3, the content of the YAG powder was 77.5% by mass, the content of the CASN fluorescent material powder was 5% by mass, and the content of the LuAG:Ce fluorescent material powder was 17.5% by mass, relative to 100% by mass of the total amount of the YAG powder, the CASN fluorescent material powder, and the LuAG:Ce fluorescent material powder.

Example 4

A wavelength converting member was obtained in the same manner as in Example 1 except that a mixed powder was obtained by mixing 15.5 g of Sr$_4$Al$_{14}$O$_{25}$ (hereinafter also referred to as "SAE") crystalline powder having an average particle diameter of 3 μm, 1.0 g of the CASN fluorescent material powder having an average particle diameter of 7 μm, and 3.5 g of LuAG:Ce fluorescent material powder having an average particle diameter of 10 μm. As for the SAE powder, the content of the activating element (for example Eu) was less than 50 ppm in terms of mass. In the sintered body to be the wavelength converting member of Example 4, the content of the SAE powder was 77.5% by mass, the content of the CASN fluorescent material powder was 5% by mass, and the content of the LuAG:Ce fluorescent material powder was 17.5% by mass, relative to 100% by mass of the total amount of the SAE powder, the CASN fluorescent material powder, and the LuAG:Ce fluorescent material powder.

Example 5

A wavelength converting member was obtained in the same manner as in Example 1 except that a mixed powder was obtained by mixing 15.5 g of BaMgAl$_{10}$O$_{17}$ (hereinafter also referred to as "BAM") crystalline powder having an average particle diameter of 3 μm, 1.0 g of the CASN fluorescent material powder having an average particle diameter of 7 μm, and 3.5 g of LuAG:Ce fluorescent material powder having an average particle diameter of 10 μm. As for the BAM powder, the content of the activating element (for example Eu) was less than 50 ppm in terms of mass. In the sintered body to be the wavelength converting member of Example 5, the content of the BAM powder was 77.5% by mass, the content of the CASN fluorescent material powder was 5% by mass, and the content of the LuAG:Ce fluorescent material powder was 17.5% by mass, relative to 100% by mass of the total amount of the BAM powder, the CASN fluorescent material powder, and the LuAG:Ce fluorescent material powder.

Comparative Example 1

A rectangular sintered body sample having a size of 1 mm×1 mm and a thickness of 0.2 mm was obtained in the same manner as in Example 1 except that a mixed powder was obtained by mixing 17 g of borosilicate glass powder and 3 g of the CASN fluorescent material powder having an average particle diameter of 7 μm. In the sintered body, the content of the borosilicate glass powder was 85% by mass, and the content of the CASN fluorescent material powder was 15% by mass, relative to 100% by mass of the total amount of the borosilicate glass powder and the CASN fluorescent material powder.

Comparative Example 2

A rectangular sintered body sample having a size of 1 mm×1 mm and a thickness of 0.2 mm was obtained in the same manner as in Example 1 except that a mixed powder was obtained by mixing 17 g of α-alumina powder having an average particle diameter of 0.5 μm and 3 g of the CASN fluorescent material powder having an average particle diameter of 7 μm. In the sintered body, the content of the α-alumina powder was 85% by mass, and the content of the CASN fluorescent material powder was 15% by mass, relative to 100% by mass of the total amount of the α-alumina powder and the CASN fluorescent material powder.

Average Particle Diameter by FSSS Method

As for the YAG, the SAE, the BAM, the CASN fluorescent material, and the LuAG:Ce fluorescent material used in each of Examples and Comparative Examples, the average particle diameter (Fisher Sub-Sieve Sizer's Number) (μm) was measured using a Fisher Sub-Sieve Sizer Model 95 (manufactured by Fisher Scientific Inc.) according to the FSSS method.

Light Emitting Device

Each of the wavelength converting members according to Examples 1 to 5 and the sintered body samples according to Comparative Examples 1 to 2 was mounted on a blue light emitting LED (light emitting element) having a light emission peak wavelength of 455 nm to obtain a light emitting device. As for the light emitting devices according to Comparative Examples 1 and 2, no fluorescent light was emitted even when a current of 1 A was made to flow through the blue light emitting LED to irradiate excitation light.

Chromaticity Coordinates (x, y) Value and General Color Rendering Index Ra

The chromaticity coordinates (x, y) of Commission international de l'eclairage (CIE) 1931 color system and the general color rendering index Ra were measured by using a multichannel spectroscope (product name: PMA-12, manufactured by Hamamatsu Photonics K.K.) when a current of 1 A was made to flow through each of the light emitting devices using the wavelength converting members according to Examples 1 to 5. The results are shown in Table 1.

Relative Luminous Flux Ratio

The luminous flux (lm) was measured by using a total luminous flux measuring device with an integrating sphere when a current of 1 A was made to flow through each of the light emitting devices using the wavelength converting members according to Examples 1 to 5, and the relative luminous flux ratio (%) was calculated when the luminous flux of the light emitting device using the wavelength converting member of Examples 1 was used as a basis (100%). The results are shown in Table 1.

As shown in Table 1, the wavelength converting member of Example 1 emitted pink light by the excitation light emitted from the blue LED having a light emission peak wavelength of 455 nm. The wavelength converting member of Example 2 emitted red light by the excitation light emitted from the blue LED having a light emission peak wavelength of 455 nm, and had a relative luminous flux ratio higher than that of the light emitting device in Example 1.

As shown in Table 1, all of the wavelength converting members of Examples 3 to 5 emitted white light, and had a general color rendering index Ra of 85 or more. Particularly, in Example 3, a wavelength converting member having high color rendering and a high relative luminous flux ratio was obtained.

On the other hand, as shown in Table 1, the sintered body sample of each of Comparative Examples 1 to 2 did not emit fluorescence even by irradiating with the excitation light emitted from the blue LED having a light emission peak wavelength of 455 nm. Accordingly, it was presumed that the CASN fluorescent material in the sintered body was reacted with the borosilicate glass or the α-alumina during the calcination, and the CASN fluorescent material was oxidized and decomposed.

The wavelength converting member according to the first embodiment of the present disclosure and the wavelength converting member obtained by the production method according to the second embodiment of the present disclosure have high light conversion efficiency, can emit light with a desired color tone, and can be utilized as a wavelength converting member having high light conversion efficiency with respect to the wavelength of light emitted from an LED or an LD.

The invention claimed is:

1. A wavelength converting member, comprising:
a sintered body of a mixed powder consisting of
a fluorescent material containing at least one kind selected from the group consisting of a nitride-based fluorescent material and an oxynitride-based fluorescent material; and
an aluminate containing at least one kind selected from the group consisting of an alkaline earth metal aluminate,
wherein the alkaline earth metal aluminate is at least one kind selected from the group consisting of $(Ca,Sr,Ba)Al_2O_4$, $(Ca,Sr,Ba)_4Al_{14}O_{25}$, $(Ca,Sr,Ba)Al_{12}O_{19}$, $(Ca,Sr,Ba)Mg_2Al_{16}O_{27}$, and $(Ca,Sr,Ba)MgAl_{10}O_{17}$.

TABLE 1

| | Aluminate etc. | | | Nitride-based fluorescent material | | | Aluminate fluorescent material | | | Evaluation of wavelength converting member | | | |
|---|---|---|---|---|---|---|---|---|---|---|---|---|---|
| | Type | Powder mixed amount (g) | Content (% by mass) | Type | Powder mixed amount (g) | Content (% by mass) | Type | Powder mixed amount (g) | Content (% by mass) | Chromaticity coordinates x | y | General color rendering index Ra | Relative luminous flux ratio (%) |
| Example 1 | YAG | 17.0 | 91.9 | CASN | 1.5 | 8.1 | — | — | — | 0.42 | 0.15 | — | 100 |
| Example 2 | YAG | 17.0 | 85.0 | CASN | 3.0 | 15.0 | — | — | — | 0.63 | 0.28 | — | 136 |
| Example 3 | YAG | 15.5 | 77.5 | CASN | 1.0 | 5.0 | LuAG:Ce | 3.5 | 17.5 | 0.37 | 0.36 | 88 | 200 |
| Example 4 | SAE | 15.5 | 77.5 | CASN | 1.0 | 5.0 | LuAG:Ce | 3.5 | 17.5 | 0.32 | 0.33 | 90 | 171 |
| Example 5 | BAM | 15.5 | 77.5 | CASN | 1.0 | 5.0 | LuAG:Ce | 3.5 | 17.5 | 0.39 | 0.38 | 86 | 164 |
| Comparative Example 1 | Glass | 17.0 | 85.0 | CASN | 3.0 | 15.0 | — | — | — | No light emission | | | |
| Comparative Example 2 | α-alumina | 17.0 | 85.0 | CASN | 3.0 | 15.0 | — | — | — | No light emission | | | |

2. The wavelength converting member according to claim 1, wherein the aluminate further contains at least one kind selected from the group consisting of a rare earth aluminate.

3. The wavelength converting member according to claim 2, wherein the rare earth aluminate is at least one kind selected from the group consisting of $Y_3Al_5O_{12}$, $(Y,Gd)_3Al_5O_{12}$, $Y_3(Al,Ga)_5O_{12}$, $(Y,Gd)_3(Al,Ga)_5O_{12}$, $Tb_3Al_5O_{12}$, and $Lu_3Al_5O_{12}$.

4. The wavelength converting member according to claim 1, wherein the nitride-based fluorescent material is at least one kind selected from the group consisting of (Ca,Sr,Ba)

AlSiN$_3$:Eu, (Ca,Sr,Ba)AlSiN$_3$:Ce, (Ca,Sr,Ba)$_2$Si$_5$N$_8$:Eu, SrLiAl$_3$N$_4$:Eu, La$_3$Si$_6$N$_{11}$:Ce, CaAlSiN$_3$:Eu, CaAlSiN$_3$:Ce, (Ca,Sr)AlSiN$_3$:Eu, (Ca,Sr)AlSiN$_3$:Ce, Ca$_2$Si$_5$N$_8$:Eu, and (Ca,Sr)$_2$Si$_5$N$_8$:Eu.

5. The wavelength converting member according to claim 1, wherein the oxynitride-based fluorescent material is at least one kind selected from the group consisting of: BaSi$_2$O$_2$N$_2$:Eu; Ba$_3$Si$_6$O$_{12}$N$_2$:Eu; M$_{m/2}$Si$_{12-(m+n)}$Al$_{(m+n)}$O$_n$N$_{(16-n)}$:Eu wherein M represents at least one element selected from the group consisting of Sr, Ca, Li, and Y, parameters n and m satisfy 0.0≤n≤2.5 and 0.5≤m≤5 respectively, and the parameter n is an electric charge of M; and Si$_{6-z}$Al$_z$O$_z$N$_{8-z}$:Eu wherein parameter z satisfies 0<z<4.2.

6. The wavelength converting member according to claim 2, wherein the fluorescent material further comprises at least one rare earth aluminate fluorescent material selected from the group consisting of Y$_3$Al$_5$O$_{12}$:Ce, (Y,Gd)$_3$Al$_5$O$_{12}$:Ce, Y$_3$(Al,Ga)$_5$O$_{12}$:Ce, (Y,Gd)$_3$(Al,Ga)$_5$O$_{12}$:Ce, Tb$_3$Al$_5$O$_{12}$:Ce, and Lu$_3$Al$_5$O$_{12}$:Ce.

7. The wavelength converting member according to claim 1, wherein the fluorescent material further comprises at least one alkaline earth metal aluminate fluorescent material selected from the group consisting of SrAl$_2$O$_4$:Eu, Sr$_4$Al$_{14}$O$_{25}$:Eu, BaMg$_2$Al$_{16}$O$_{27}$:Eu, BaMgAl$_{10}$O$_{17}$:Mn, BaMgAl$_{10}$O$_{17}$:Eu, Sr$_4$Al$_{14}$O$_{25}$:Eu,Mn, CaAl$_2$O$_4$:Eu,Mn, BaMg$_2$Al$_{16}$O$_{27}$:Eu,Mn, and BaMgAl$_{10}$O$_{17}$:Eu,Mn.

8. The wavelength converting member according to claim 2, wherein the nitride-based fluorescent material is CaAlSiN$_3$:Eu, and the rare earth aluminate is Y$_3$Al$_5$O$_{12}$.

9. The wavelength converting member according to claim 1, wherein the content of the aluminate is 50% by mass or more.

10. A method for producing a wavelength converting member, comprising:
preparing a molded body formed by a mixed powder consisting of
a fluorescent material containing at least one kind selected from the group consisting of a nitride-based fluorescent material and an oxynitride-based fluorescent material and
an aluminate containing at least one kind selected from the group consisting of an alkaline earth metal aluminate; and
sintering the molded body to obtain a wavelength converting member containing a sintered body consisting of the fluorescent material and the aluminate,
wherein the alkaline earth metal aluminate is at least one kind selected from the group consisting of (Ca,Sr,Ba)Al$_2$O$_4$, (Ca,Sr,Ba)$_4$Al$_{14}$O$_{25}$, (Ca,Sr,Ba)Al$_{12}$O$_{19}$, (Ca,Sr,Ba)Mg$_2$Al$_{16}$O$_{27}$, and (Ca,Sr,Ba)MgAl$_{10}$O$_{17}$.

11. The method for producing a wavelength converting member according to claim 10, wherein the aluminate further contains at least one kind selected from the group consisting of a rare earth aluminate.

12. The method for producing a wavelength converting member according to claim 10, wherein the content of the aluminate is 50% by mass or more relative to a total amount of a mixed powder obtained by mixing the aluminate and the fluorescent material.

13. The method for producing a wavelength converting member according to claim 10, wherein the average particle diameter of the aluminate is in a range of 1 or more and 25 μm or less.

14. The method for producing a wavelength converting member according to claim 10, wherein the average particle diameter of the fluorescent material is in a range of 1 μm or more and 25 μm or less.

15. The method for producing a wavelength converting member according to claim 11, wherein the nitride-based fluorescent material is CaAlSiN$_3$:Eu, and the rare earth aluminate is Y$_3$Al$_5$O$_{12}$.

* * * * *